(12) United States Patent
Tada et al.

(10) Patent No.: US 7,875,940 B2
(45) Date of Patent: Jan. 25, 2011

(54) MICROMACHINE AND PRODUCTION METHOD THEREOF

(75) Inventors: Masahiro Tada, Kanagawa (JP);
Takashi Kinoshita, Kanagawa (JP);
Takeshi Taniguchi, Kanagawa (JP);
Koichi Ikeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 34 days.

(21) Appl. No.: 11/530,774

(22) Filed: Sep. 11, 2006

(65) Prior Publication Data

US 2007/0018262 A1     Jan. 25, 2007

Related U.S. Application Data

(63) Continuation of application No. 10/492,397, filed as application No. PCT/JP03/10150 on Aug. 8, 2003, now abandoned.

(30) Foreign Application Priority Data

Aug. 9, 2002    (JP) ............... P2002-232324

(51) Int. Cl.
*H01L 29/82* (2006.01)
(52) U.S. Cl. .......... 257/414; 257/415; 257/254
(58) Field of Classification Search ........ 257/415, 257/414

See application file for complete search history.

(56) References Cited

U.S. PATENT DOCUMENTS

| | | | | |
|---|---|---|---|---|
| 3,634,787 A | * | 1/1972 | Newell | ............ 333/186 |
| 3,699,482 A | * | 10/1972 | Ash et al. | ............ 333/150 |
| 4,671,852 A | * | 6/1987 | Pyke | ............ 438/49 |
| 5,019,885 A | * | 5/1991 | Yagawara et al. | ............ 73/23.4 |
| 5,115,292 A | * | 5/1992 | Takebe et al. | ............ 257/415 |
| 5,744,373 A | * | 4/1998 | Arai | ............ 438/442 |
| 6,557,414 B2 | * | 5/2003 | Sakurai et al. | ............ 73/504.04 |
| 6,635,506 B2 | * | 10/2003 | Volant et al. | ............ 438/52 |
| 7,049,804 B2 | * | 5/2006 | Ichimura et al. | ............ 324/457 |
| 7,061,063 B2 | * | 6/2006 | Kato et al. | ............ 257/417 |
| 7,102,268 B2 | * | 9/2006 | Matsuhisa | ............ 310/309 |

(Continued)

FOREIGN PATENT DOCUMENTS

EP    1263134    5/2002

(Continued)

OTHER PUBLICATIONS

Communication enclosing Search Report for European Application No. 03784618.5-2203 dated Aug. 9, 2007.

(Continued)

*Primary Examiner*—Zandra Smith
*Assistant Examiner*—Tsz K Chiu
(74) *Attorney, Agent, or Firm*—SNR Denton US LLP

(57) ABSTRACT

A micromachine for a high-frequency filter which has a high Q value and a higher frequency band is provided. The micromachine includes an electrode provided on a substrate, an inter-layer insulation film composed of a first insulation film and a second insulation film which are provided on the substrate in the state of covering the electrode, a hole pattern provided in the second insulation film in the state of reaching the electrode, and a belt-like vibrator electrode provided on the second insulation film so as to cross the upper side of a space portion constituted of the inside of the hole pattern.

20 Claims, 8 Drawing Sheets

U.S. PATENT DOCUMENTS

| | | | |
|---|---|---|---|
| 2002/0017134 A1* | 2/2002 | Sakurai et al. | 73/504.02 |
| 2002/0074897 A1* | 6/2002 | Ma et al. | 310/311 |
| 2008/0233673 A1* | 9/2008 | Igarashi | 438/50 |
| 2008/0284282 A1* | 11/2008 | Fujimoto | 310/317 |

FOREIGN PATENT DOCUMENTS

| | | |
|---|---|---|
| EP | 1217735 | 6/2002 |
| WO | 03/054938 | 7/2003 |
| WO | 03054938 | 7/2003 |

OTHER PUBLICATIONS

Japanese Application No. 2002-232324 issued Sep. 4, 2006 Office Action.

* cited by examiner

MICROMACHINE AND PRODUCTION METHOD THEREOF

RELATED APPLICATION DATA

This application is a continuation of and claims the benefit of priority to U.S. application Ser. No. 10/492,397, filed on Apr. 8, 2004 now abandoned, which is a nationalization application under 35 U.S.C. 371 of PCT Application PCT/JP03/10150, filed on Aug. 8, 2003, both of which are incorporated herein by reference to the extent permitted by law. This application also claims the benefit of priority to Japanese Patent Application P2002-2322324, filed on Aug. 9, 2002, which is also incorporated herein by reference to the extent permitted by law.

BACKGROUND

The present invention relates to a micromachine and a method of manufacturing the same, particularly to a micromachine including a vibrator electrode crossing over an output electrode, with a space portion therebetween, and a method of manufacturing the same.

Attendant on the advance of the technology of micro-processing on substrates, attention has been paid to the micromachine technology in which a micro-structure and an electrode, a semiconductor integrated circuit and the like for controlling the driving of the micro-structure are provided on a substrate such as a silicon substrate, a glass substrate, etc.

Among the micromachines, there is a micro-vibrator proposed to be utilized as a high-frequency filter for radio communication. As shown in FIG. 8, a micro-vibrator 100 includes a vibrator electrode 103 disposed over an output electrode 102a provided on a substrate 101, with a space portion A therebetween. The vibrator electrode 103 has one end portion connected to an input electrode 102b, which is constituted of the same conductive layer as the output electrode 102a. When a specified frequency voltage is impressed on the input electrode 102b, a beam (vibrating portion) 103a of the vibrator electrode 103 provided over the output electrode 102a with the space portion A therebetween is vibrated at a natural vibration frequency, whereby the capacitance of a capacitor constituted of the space portion A between the output electrode 102a and the beam (vibrating portion) 103a is varied, and the variation in capacitance is outputted from the output electrode 102a. A high-frequency filter composed of the micro-vibrator 100 having such a configuration can realize a higher Q value, as compared with high-frequency filters utilizing surface elastic wave (SAW) or thin film elastic wave (FBAR).

The micro-vibrator as above-mentioned is manufactured as follows. First, as shown in FIG. 9A, an output electrode 102a, an input electrode 102b, and a support electrode 102c which are formed of polysilicon are provided on a substrate 101 whose surface has been covered with an insulation film. These electrodes 102a to 102c are so arranged that the input electrode 102b and the support electrode 102c are disposed on the opposite sides of the output electrode 102a. Next, a sacrificing layer 105 formed of silicon oxide is provided on the substrate 101 in the state of covering the electrodes 102a to 102c.

Subsequently, as shown in FIG. 9B, the sacrificing layer 105 is provided with connection holes 105b and 105c reaching the input electrode 102b and the support electrode 102c, respectively. Thereafter, a polysilicon layer 106 is provided on the upper side of the sacrificing layer 105, inclusive of the inside of the connection holes 105b and 105c.

Next, as shown in FIG. 9C, the polysilicon layer 106 is patterningly etched, to form a belt-like vibrator electrode 103 extending over the output electrode 102a. In this case, in order to prevent the input electrode 102b and the support electrode 102c formed of polysilicon from being etched, the polysilicon layer 106 is patterningly etched so that the connection holes 105b and 105c are entirely covered.

Thereafter, the sacrificing layer 105 is selectively removed, to form the space portion A between the output electrode 102a and the vibrator electrode 103, thereby completing the micro-vibrator 100, as shown in FIGS. 9A to 9C.

FIG. 10 is a diagram showing the relationship between the length (beam length) L of the beam (vibrating portion) 103a of the micro-vibrator 100 configured as above and the natural vibration frequency. As shown in the diagram, the theoretical natural vibration frequency (Theory) based on the following formula (1) is proportional to $(1/L^2)$. Therefore, in order to achieve a higher frequency, it is necessary to reduce the beam length L.

$$f_R = \frac{0.162h}{L^2}\sqrt{\frac{EK}{\rho}} \quad (1)$$

where h is film thickness, E is Young's modulus, K is electromagnetic coupling factor, and $\rho$ is film density.

In the above-mentioned micro-vibrator 100, however, since the space portion A and the vibrator electrode 103 are so provided as to bridge over the output electrode 102a, it is impossible to set the beam length L smaller than the line width of the output electrode 102a.

In addition, where it is intended to miniaturize the beam length L in order to obtain a higher frequency, it is necessary to miniaturize also the line width of the output electrode 102a, so that the capacitance between the output electrode 102a and the vibrator electrode 103 is reduced, resulting in a lower output. The above-mentioned points constitute factors which restrict the achievement of a higher frequency through miniaturizing the beam length L.

Accordingly, it is an object of the present invention to provide a micromachine including a vibrator electrode which promises a further advance in achieving a higher frequency through miniaturization of beam length, and a method of manufacturing the same.

SUMMARY OF THE INVENTION

In order to attain the above object, a micromachine according to the present invention includes a vibrator electrode, and is configured as follows. The micromachine according to the present invention has a structure in which an inter-layer insulation film covering an output electrode on a substrate is provided with a hole pattern reaching the output electrode. On the inter-layer insulation film, a belt-like vibrator electrode is provided so as to cross the upper side of the hole pattern which functions as a space portion.

In the micromachine configured as above, the vibrator electrode is so disposed as to cross the upper side of the hole pattern formed in the inter-layer insulation film as the space portion. Therefore, the vibrator electrode portion crossing over the hole pattern constitutes a beam (vibrating portion) of the vibrator electrode. Accordingly, the length of the beam (vibrating portion) is set by the size of the hole pattern, without dependence on the width of the output electrode, and a vibrator electrode having a beam (vibrating portion) shorter than the width of the output electrode is obtained.

The present invention resides also in a method of manufacturing a micromachine configured as above, the method being carried out in the following procedure. First, an inter-layer insulation film is formed on a substrate in the state of covering an output electrode on the substrate, and the inter-layer insulation film is provided with a hole pattern reaching the output electrode. Next, the surface of the output electrode in a bottom portion of the hole pattern is covered with a sacrificing layer, and a belt-like vibrator electrode crossing over the hole pattern in the state of exposing a part of the hole pattern is patternedly formed on the sacrificing layer and the inter-layer insulation film. Thereafter, the sacrificing layer in the hole pattern is selectively removed, to thereby provide a space portion between the output electrode and the vibrator electrode.

Following such a formation procedure, a micromachine having a vibrator electrode configured as above-mentioned is obtained.

DETAILED DESCRIPTION OF THE PREFERRED EMBODIMENTS

Now, some embodiments of the present invention will be described in detail below, based on the drawings. In each of the following embodiments, a manufacturing method will be described first, and the configuration of a micromachine obtained thereby will be described next.

First Embodiment

Figure 1A:
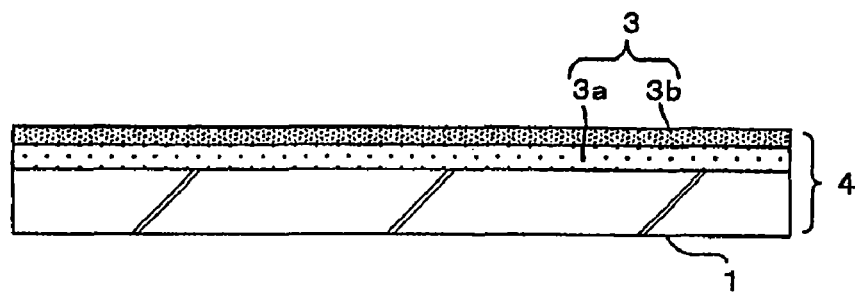
FIGS. 1A to 1H are sectional step diagrams showing a manufacturing method according to a first embodiment.
Figure 1B:
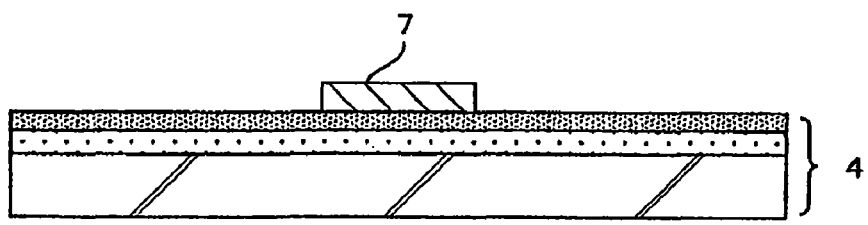
Figure 1C:
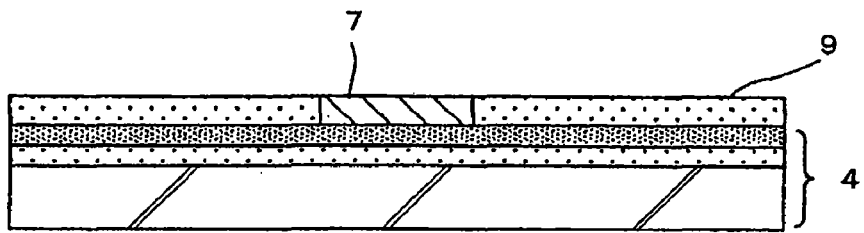
Figure 1D:
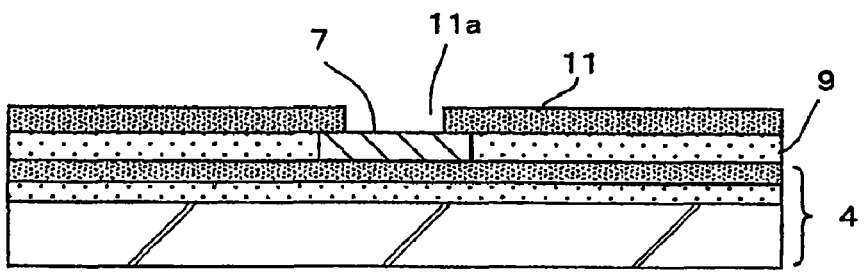
Figure 1E:
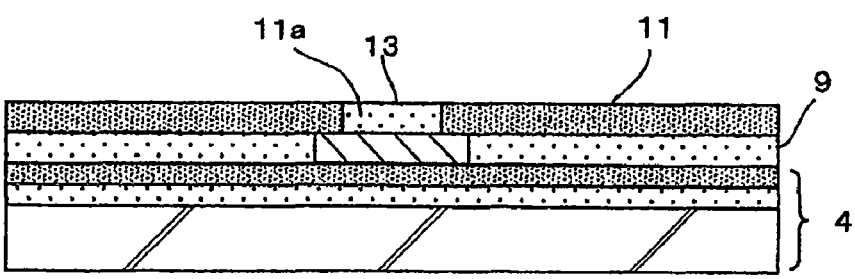
Figure 1F:
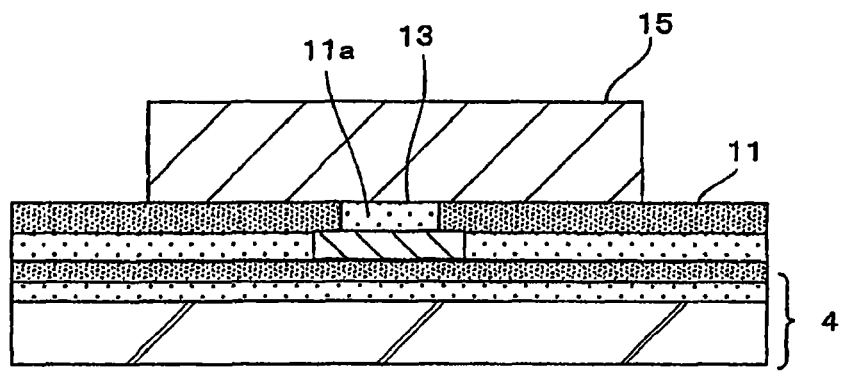
Figure 1G:
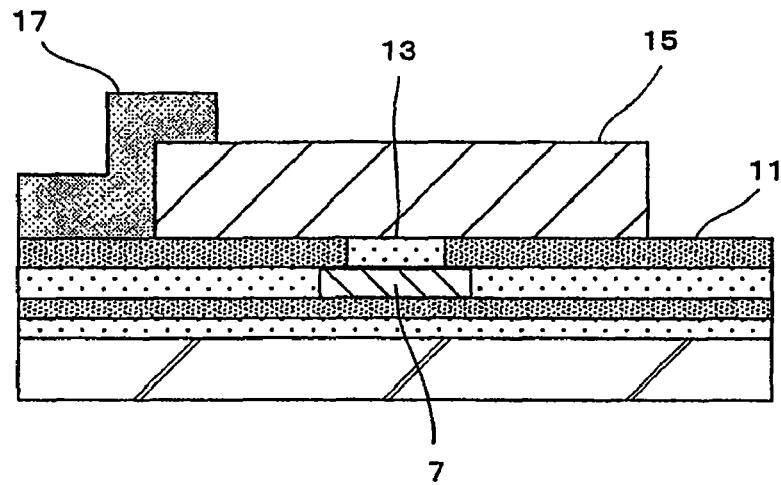
Figure 1H:
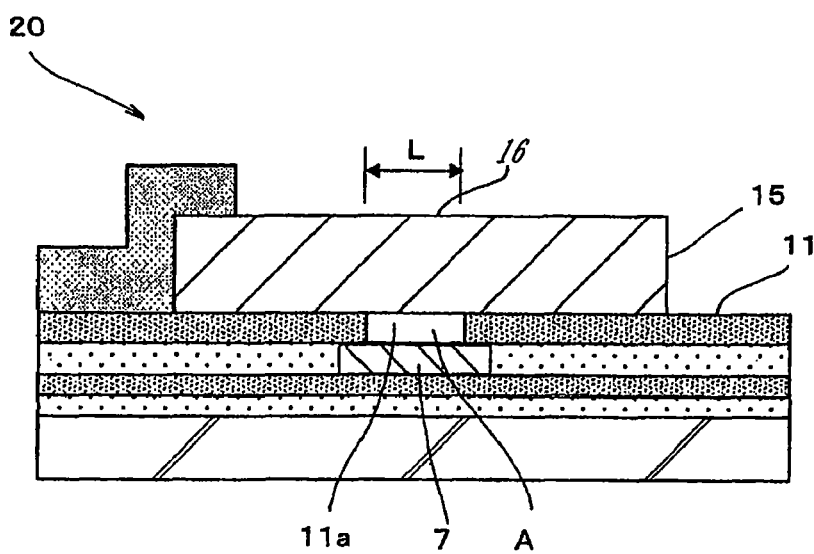
Figure 2:
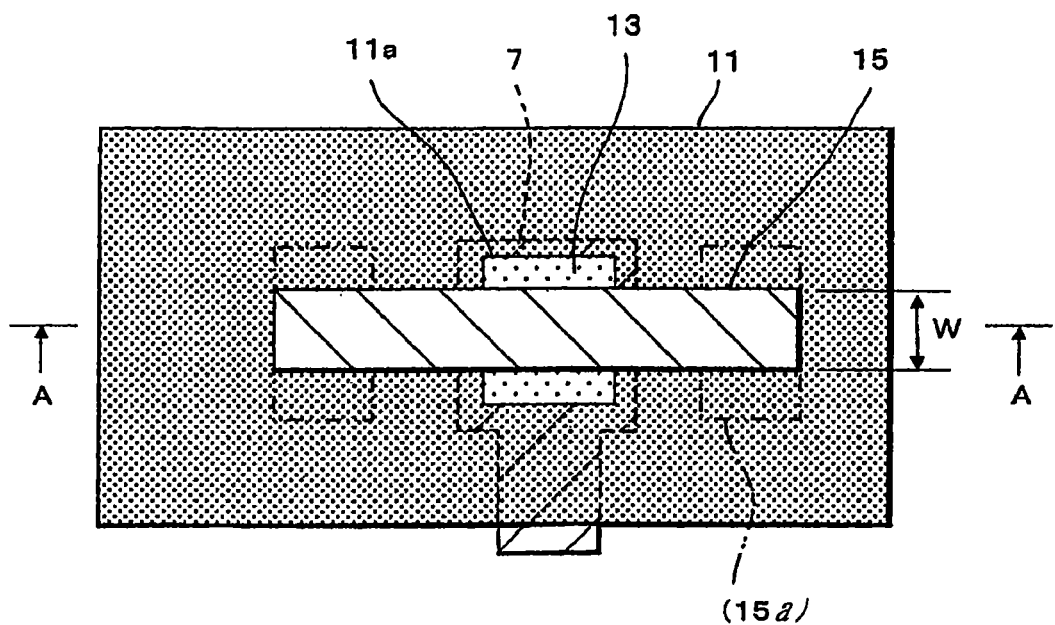
FIG. 2 is a plan view corresponding to FIG. 1F.
Figure 3:
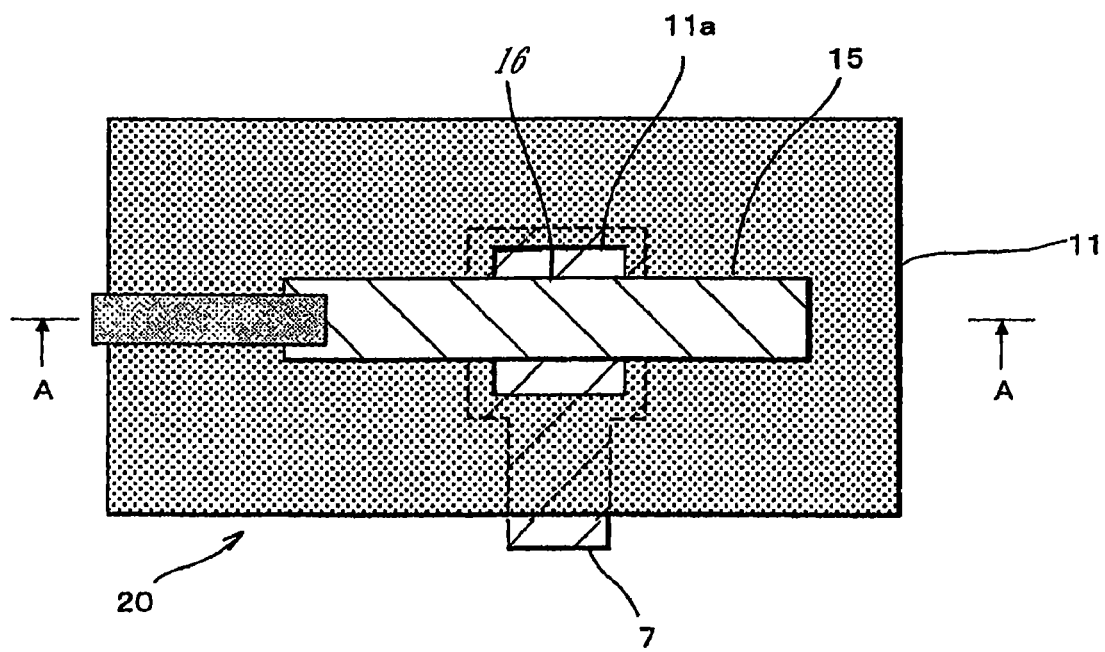
FIG. 3 is a plan view corresponding to FIG. 1H.

FIGS. 1A to 1H are sectional step diagrams showing a manufacturing method according to a first embodiment, and FIGS. 2 and 3 are plan views for illustrating the manufacturing method according to the first embodiment. Here, based on FIGS. 1A to 1H, and referring to FIGS. 2 and 3, the method of manufacturing a micromachine according to the first embodiment will be described. Incidentally, FIGS. 1A to 1H correspond to section A-A in the plan views in FIGS. 2 and 3.

First, as shown in FIG. 1A, a substrate 4 including a semi-conductor substrate 1, formed of single-crystalline silicon or the like, covered thereon with an insulation layer 3 is prepared. Preferably, the outermost surface of the insulation layer 3 is formed of a material resistant to the etching in the etching-away of a sacrificing layer (for example, silicon oxide) which is conducted subsequently. Therefore, for example, a silicon oxide film 3a for alleviating stresses between the insulation layer 3 and the semiconductor substrate 1 and a silicon nitride film 3b having the above-mentioned etching resistance are laminated in this order, to form the insulation layer 3.

Next, as shown in FIG. 1B, an output electrode 7 formed by patterning a first conductive layer is provided on the substrate 4. The first conductive layer constituting the output electrode 7 is composed, for example, of a silicon layer formed of phosphorus (P)-containing polysilicon or the like.

Thereafter, as shown in FIG. 1C, the upper side of the substrate 4 is covered with a first insulation film 9, in the condition where the surface of the output electrode 7 is exposed. In this case, for example, the first insulation film 9 is formed on the substrate 4 in a film thickness larger than the film thickness of the output electrode 7 so that the output electrode 7 is embedded therein, and the first insulation film 9 is polished until the output electrode 7 is exposed, whereby the surface of the output electrode 7 is exposed from the first insulation film 9. The first insulation film 9 is composed, for example, of silicon oxide.

Next, as shown in FIG. 1D, a second insulation film 11 composed of an insulating material resistant to the etching in the etching-away of a sacrificing layer which is conducted later is formed on the output electrode 7 and the first insulation film 9. In this case, where the above-mentioned sacrificing layer is formed of silicon oxide, for example, the second insulation film 11 is formed of silicon nitride. As a result, an inter-layer insulation film which is constituted of the first insulation film 9 and the second insulation film 11 and which embeds the output electrode 7 therein is obtained. The surface of the inter-layer insulation film is made to be substantially flat. Incidentally, the inter-layer insulation film may not necessarily be formed to embed the output electrode 7 while having a flat surface; for example, the inter-layer insulation film may cover the output electrode 7 while having a surface shape following up to the disposition of the output electrode 7, or may have a film thickness smaller than the film thickness of the output electrode 7.

Thereafter, the second insulation film 11 is provided with a hole pattern 11a reaching the output electrode 7. The hole pattern 11a is formed by etching the second insulation film 11 by use of a resist pattern (not shown) as a mask. The hole pattern 11a formed here is disposed only on the upper side of the output electrode 7, without protruding from the area of the output electrode 7.

Next, as shown in FIG. 1E, the surface of the output electrode 7 exposed in a bottom portion of the hole pattern 11a is covered with the sacrificing layer 13. The sacrificing layer 13 is composed of a material which can be removed selectively in relation to the second insulation film 11, for example, silicon oxide. In this case, for example, an oxide film may be grown on the surface of the output electrode 7 composed of polysilicon by using as a mask the second insulation film 11 composed of silicon nitride, thereby covering the exposed surface of the output electrode 7 with the sacrificing layer 13 composed of silicon oxide. Alternatively, a sacrificing layer 13 composed of silicon oxide may be built up on the second insulation film 11, and then the surface of the sacrificing layer 13 may be polished until the second insulation film 11 is exposed.

Thereafter, as shown in FIG. 1F and FIG. 2, a vibrator electrode 15 is patternedly formed on the sacrificing layer 13 and the second insulation film 11, in the state of crossing the upper side of the hole pattern 11a. The vibrator electrode 15 is formed in a belt-like pattern such that a part of the hole pattern 11a and a part of the sacrificing layer 13 formed in the hole pattern 11a are exposed. In this case, for example as shown in FIG. 2, the hole pattern 11a and the sacrificing layer 13 may be exposed on both sides in the width W direction of the vibrator electrode 15. Alternatively, the hole pattern 11a and the sacrificing layer 13 may be exposed only on one side in the width W direction of the vibrator electrode 15. Incidentally, where the surface of the inter-layer insulation film (hence, the first insulation film 9 and the second insulation film 11) embedding the output electrode 7 therein is made to be substantially flat as has been described referring to FIG. 1D, the vibrator electrode 15 is formed on the flat surface. Therefore, in this step, it is possible to minimize the over-etching amount in pattern formation of the vibrator electrode 15, and to reduce the damage to the base layer (inter-layer insulation film).

Next, as shown in FIG. 1G, a wiring 17 connected to the vibration electrode 15 is formed on the second insulation film 11. In forming the wiring 17, for example, first, a seed layer (not shown) of gold (Au) is formed on the whole surface of the substrate 4, and then a resist pattern (not shown) for exposing the portion intended for formation of the wiring while covering the other portions is formed. Next, a plating layer is grown on the seed layer in the opening portion of the resist pattern by a plating technique, to form the wiring 17. After the formation of the wiring 17, the resist pattern is removed, and, further, a whole-surface etching is conducted for removing the seed layer. Incidentally, in forming the vibrator electrode 15, a wiring composed of the same layer as the vibrator electrode 15 may be formed in continuity with the vibrator electrode 15; in that case, it is unnecessary to separately provide the wiring 17.

Thereafter, the sacrificing layer 13 is etched away selectively in relation to the wiring 17, the vibrator electrode 15, the second insulation film 11 and the output electrode 7. In this case, wet etching by use of buffered hydrofluoric acid is conducted, whereby the sacrificing layer 13 composed of silicon oxide on the lower side of the vibrator electrode 15 is securely removed.

As a result, as shown in FIG. 1H and FIG. 3, a space portion (gap) A is formed by removal of the sacrificing layer on the lower side of the vibrator electrode 15, and the output electrode 7 at the bottom portion of the hole pattern 11a is exposed. Accordingly, there is obtained a micromachine 20 including the belt-like vibrator electrode 15 provided on the second insulation film 11 in the form of crossing the upper side of the hole pattern 11a provided as the space portion A.

In the micromachine 20 configured as above, the hole pattern 11a formed in the second insulation film 11 is provided as the space portion A, and the vibrator electrode 15 is disposed to cross the upper side of the space portion A. Therefore, where the vibrator electrode 15 is vibrated by impressing a specified frequency voltage thereon, that portion of the vibration electrode 15 which crosses over the hole pattern 11a is vibrated, and the portion thus constitutes a beam (vibrating portion) 16 of the vibrator electrode 15. Therefore, the length (beam length L) of the beam (vibrating portion) is set by the size of the hole pattern 11a.

Accordingly, the following can be said. In a micromachine having the conventional structure in which the space portion A and the vibrator electrode 103 are disposed so as to bridge over the output electrode 102a as has been described above referring to FIG. 8, it has been impossible to set the beam length L of the vibrator electrode 103 smaller than the minimum processed size of the output electrode 102a. In contrast, in the micromachine 20 according to the first embodiment of the present invention as shown in FIG. 1H and FIG. 3, it is possible to reduce the beam length L of the vibrator electrode 15 to the minimum processed size of the hole pattern 11a, independently of the line width of the output electrode 7. Therefore, it is possible to achieve a further miniaturization of the beam length L and to thereby achieve a further higher frequency.

Here, comparison of the capacitance generated between the vibrator electrode 15 and the output electrode 7 is made, between the micromachine having the conventional structure (see FIG. 8) and the micromachine 20 according to the first embodiment of the present invention. In the micromachine 20 according to the first embodiment, the area of the opposed portions of the vibrator electrode 15 and the output electrode 7 can be made larger in relation to the beam length L, so that the capacitance in relation to the beam length L can be made greater. Therefore, even where the beam length L is miniaturized for the purpose of obtaining a higher frequency, it is possible to maintain the output.

Furthermore, in the micromachine 20 having the configuration according to the first embodiment, both end portion, i.e., the anchor portions for supporting the beam (vibrating portion) 16, of the vibrator electrode 15 are fixed to the second insulation film 11 over the entire surfaces thereof. Therefore, where the vibrator electrode 15 is vibrated by impressing a predetermined frequency voltage is impressed thereon, only the beam (vibrating portion) 16 relates to vibration, in generating vibration. Accordingly, the natural vibration frequency is closer to the theoretical value satisfying the above-mentioned formula (1) (the value inversely proportional to the square of the length L of the vibrating portion). This also makes it easier to achieve a higher frequency through miniaturization.

Figure 8:
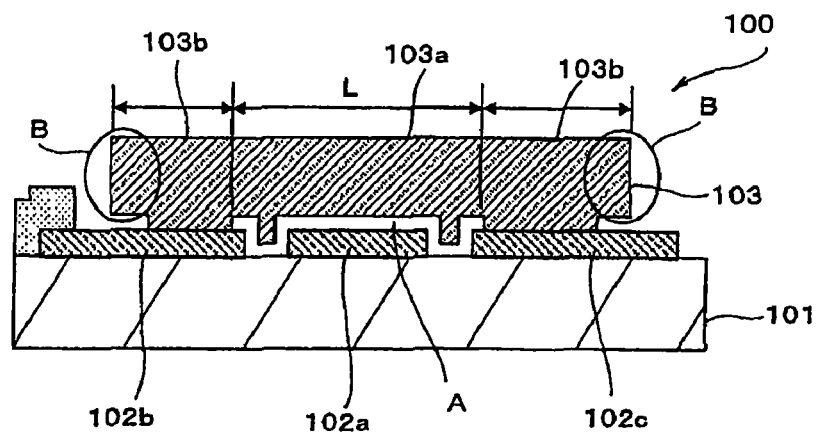
FIG. 8 shows the configuration of a micromachine (micro-vibrator) according to the prior art.
Figure 9A:
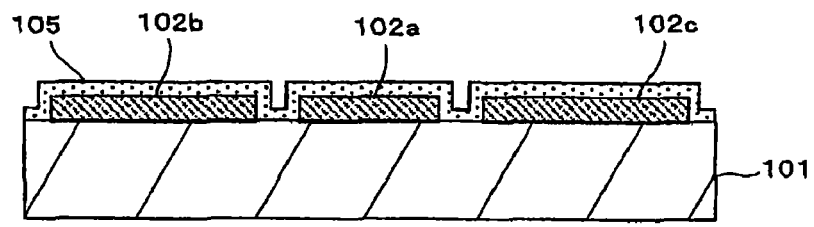
FIGS. 9A to 9C are sectional step diagrams showing a manufacturing method according to the prior art.
Figure 9B:
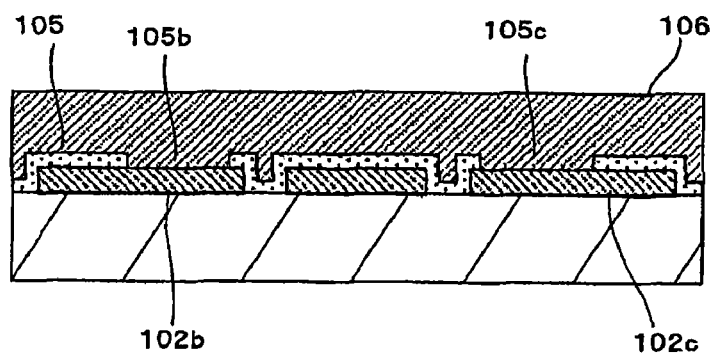
Figure 9C:
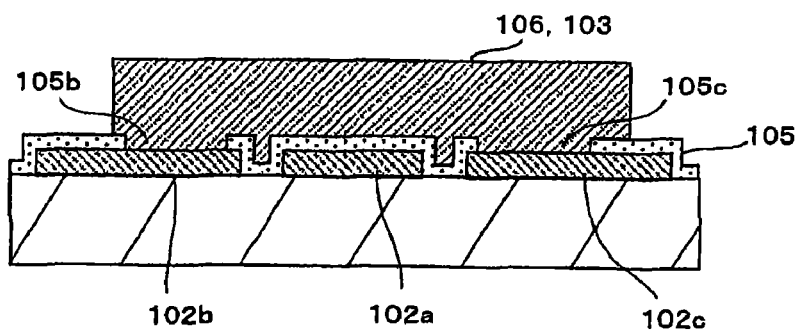
Figure 10:
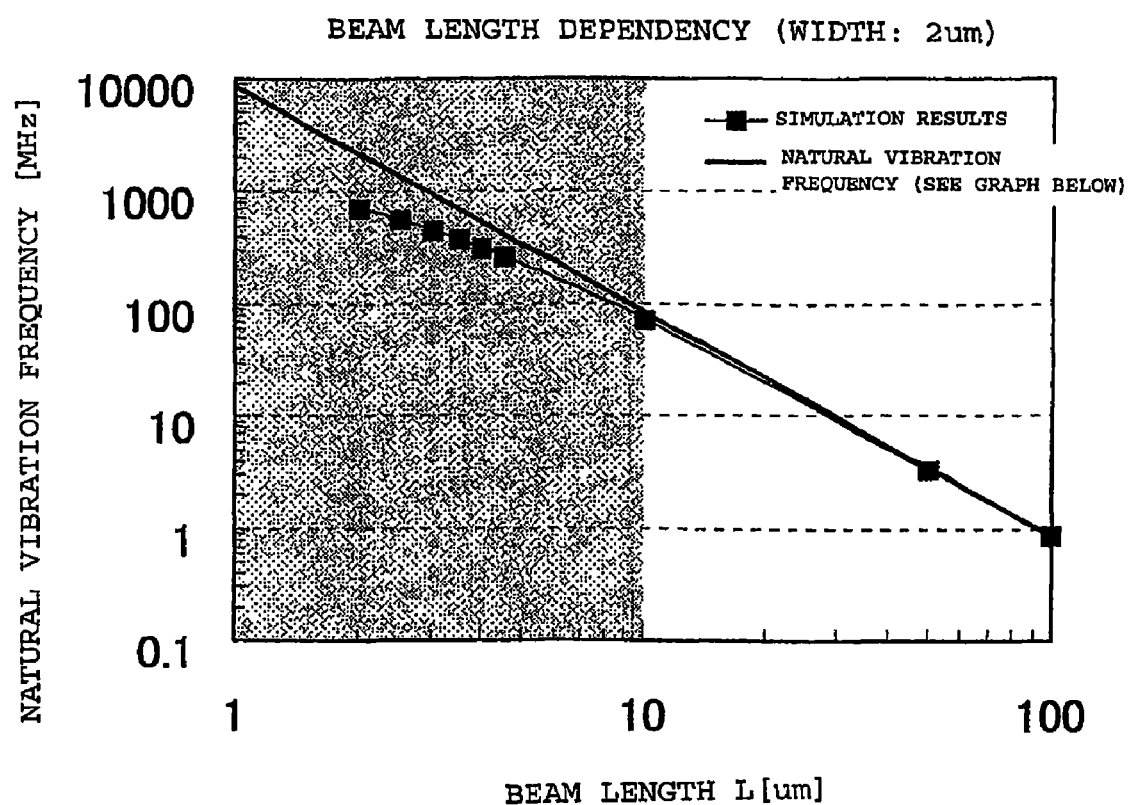
FIG. 10 is a graph for illustrating the problems involved in a micromachine according to the prior art.

On the other hand, in the micromachine 20 having the conventional configuration shown in FIG. 8, due to convenience in manufacturing process, the tip ends of the anchor portions for supporting the beam (vibrating portion) 103a include eaves-like portions B not making close contact with the base; in such a configuration, therefore, the eaves-like portions B have had an influence on the vibration of the beam (vibrating portion) 103a. Accordingly, as indicated by the simulation results (Simulation) in FIG. 10, in the region where the beam length (L) is-miniaturized, the natural vibration frequency is less than the theoretical value satisfying the above-mentioned formula (1). Thus, it has been difficult to achieve a higher frequency through miniaturization of the beam length L.

As a result of the foregoing, by use of the micromachine 20 configured according to this embodiment, it is possible to realize a high-frequency filter having a high Q value and a higher frequency band.

In addition, particularly where the surface of the inter-layer insulation film (hence, the first insulation film 9 and the second insulation film 11) embedding the output electrode 7 therein is made to be flat, it is possible to minimize the parasitic capacitance (capacitance which does not contribute to vibration) generated between the output electrode 7 and the vibrator electrode 15 through the inter-layer insulation film. Therefore, in a high-frequency filter composed of the micromachine 20, it is also possible to contrive a higher selectivity of frequency (transmission characteristics).

In the first embodiment above, description has been made of the case where the line width W of the vibrator electrode 15 is constant, as shown in FIG. 2. However, as indicated by the two-dotted chain line in FIG. 2, the vibrator electrode (15a) may have such a shape that larger-line-width portions are provided at both end portions. Where the vibrator electrode (15a) with such a shape is provided, it is possible to achieve more secure support of the beam (vibrating portion) 16 at end portions of the vibrator electrode (15a). As a result, it is possible to make the natural vibration frequency more closer to the theoretical value satisfying the above-mentioned formula (1) (the value inversely proportional to the square of the length L of the vibrating portion).

Besides, in the conventional micromachine described referring to FIG. 8, it has been necessary that a connection portion for connecting the vibrator electrode 15 to the input electrode 102b composed of the same layer as the output electrode 102a should be provided at one end of the vibrator electrode 103.

Figure 4:
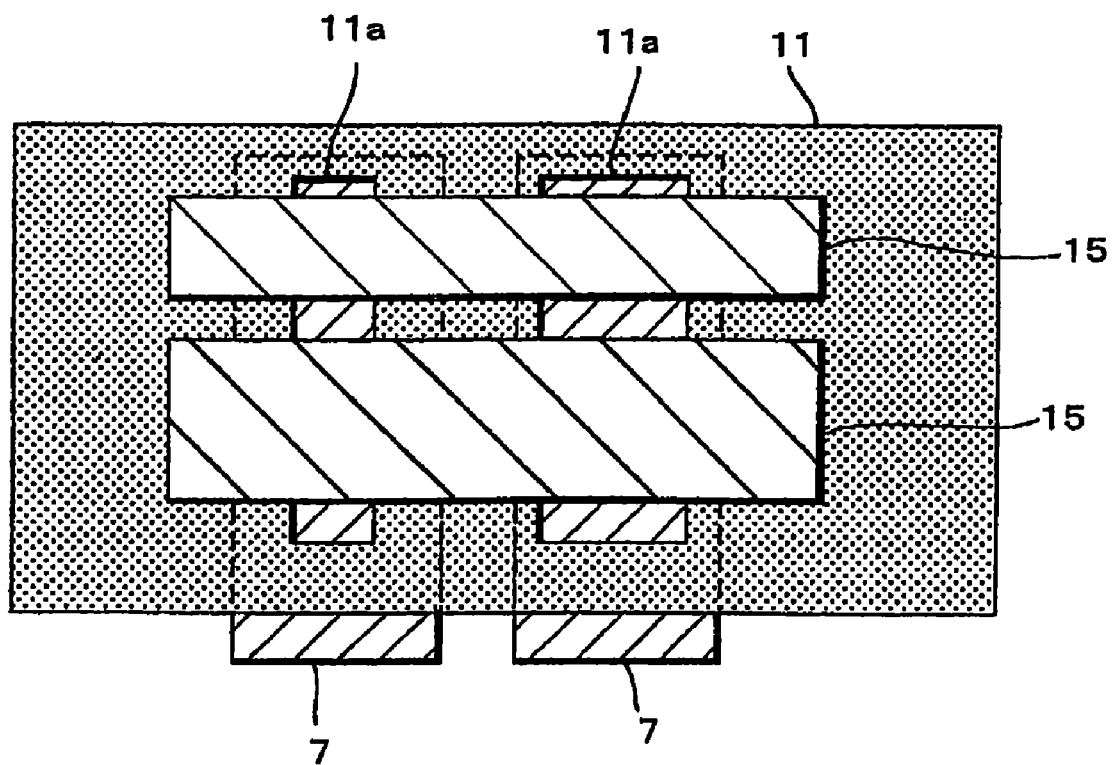
FIG. 4 is a plan view showing a modified example of the first embodiment.

On the other hand, in the micromachine 20 according to the first embodiment of the present invention, the vibrator electrode 15 itself functions also as the input electrode, so that it is unnecessary to provide the above-mentioned connection portion and, hence, it is unnecessary to take into account an alignment error in forming such a connection portion. Therefore, as shown in FIG. 4, it is possible to decrease the pitch of the vibrator electrodes 15 and the pitch of the output electrodes 7, which is advantageous to achievement of a higher degree of integration. Moreover, since the vibrator electrode 15 functions also as the input electrode, when hole patterns 11a and 11a giving respective natural vibration frequencies are arranged in a gate array pattern, circuits with various modes can be configured by only changing the layout of the vibrator electrode 15.

Second Embodiment

Figure 5A:
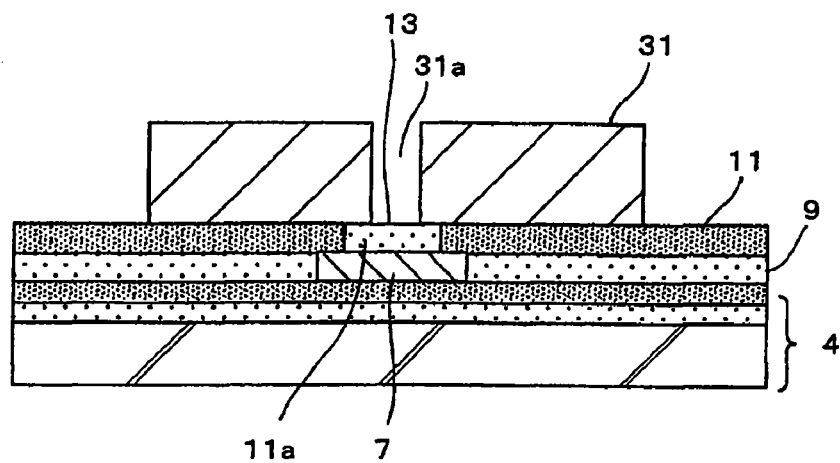
FIGS. 5A to 5C are sectional step diagrams showing a manufacturing method according to a second embodiment.
Figure 5B:
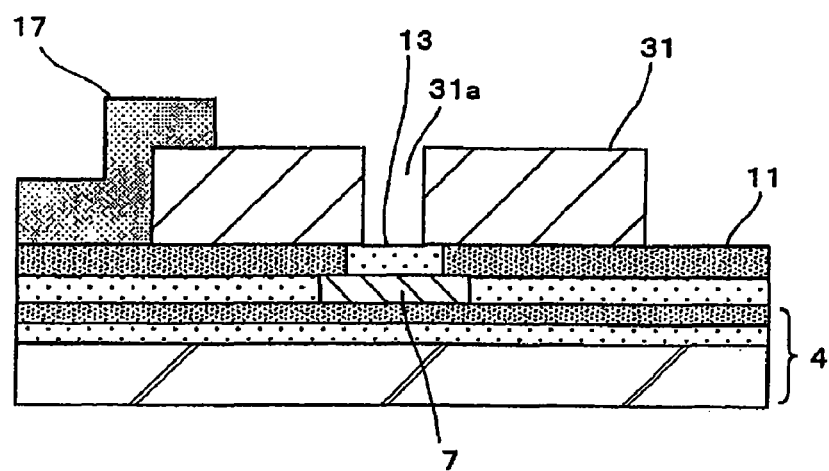
Figure 5C:
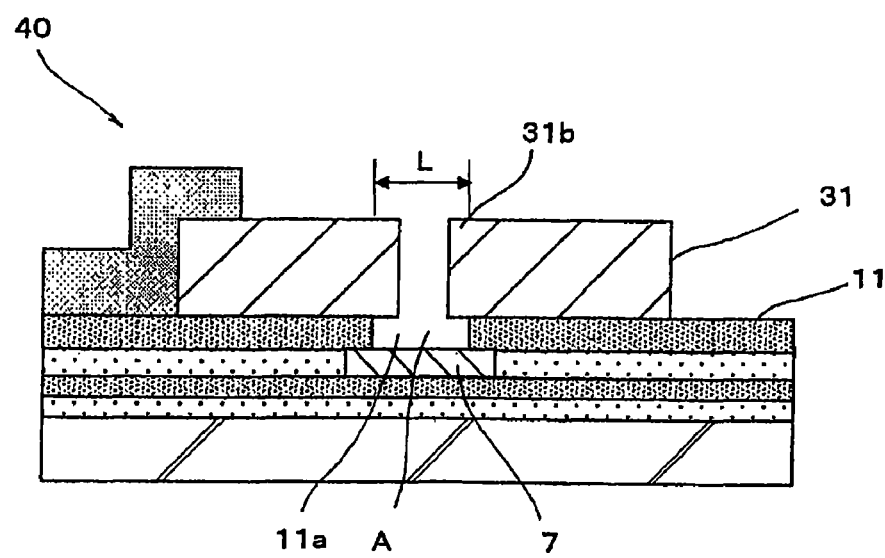
Figure 6:
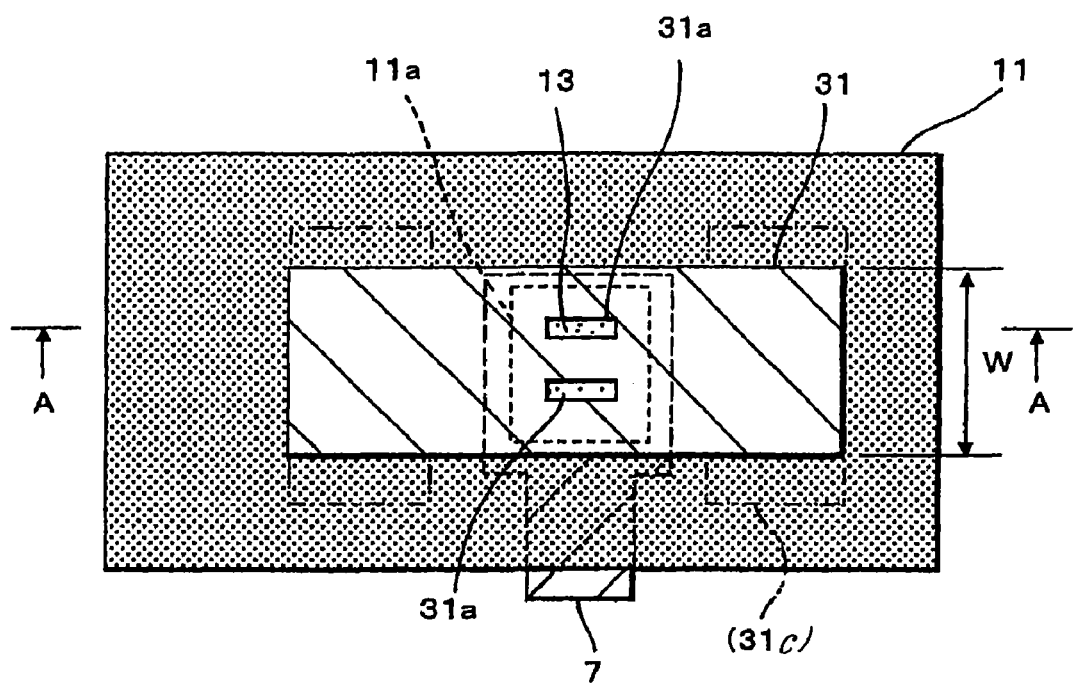
FIG. 6 is a plan view corresponding to FIG. 5A.
Figure 7:
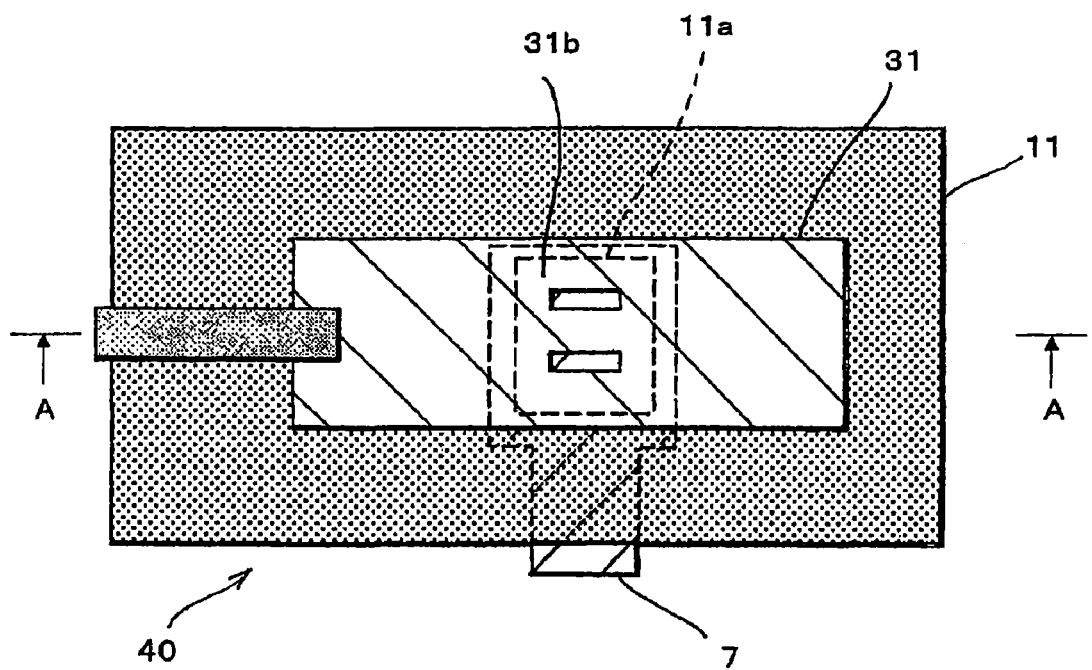
FIG. 7 is a plan view corresponding to FIG. 5C.

FIGS. 5A to 5C are sectional step diagrams showing a manufacturing method according to a second embodiment of the present invention, and FIGS. 6 and 7 are plan views for illustrating the manufacturing method according to the second embodiment. Here, based on FIGS. 5A to 5C, and referring to FIGS. 6 and 7, the method of manufacturing a micromachine according to the second embodiment will be described. Incidentally, FIGS. 5A to 5C correspond to section A-A in the plan views in FIGS. 6 and 7.

First, the same steps as those described above referring to FIGS. 1A to 1E in the first embodiment are carried out. As a result of the steps, an output electrode 7 and an inter-layer insulation film composed of a first insulation film 9 and a second insulation film 11 are formed on a substrate 4, the second insulation film 11 is provided with a hole pattern 11a, the output electrode 7 is exposed at a bottom portion of the hole pattern 11a, and the exposed surface of the output electrode 7 is covered with a sacrificing layer 13.

Thereafter, as shown in FIG. 5A and FIG. 6, a vibrator electrode 31 is patternedly formed on the sacrificing layer 13 and the second insulation film 11, in the state of crossing the upper side of the hole pattern 11a. The vibrator electrode 31 is formed in a belt-like pattern which closes the hole pattern 11a and is provided with a hole portion or portions 31a reaching the sacrificing layer 13 inside the hole pattern 11a, whereby the vibrator electrode 31 is so shaped that a part of the hole pattern 11a and a part of the sacrificing layer 13 formed inside the hole pattern 11a are exposed. The hole portion or portions 31a may be provided at two or more locations in the vibrator electrode 31 as shown in FIG. 6 (in the figure, two locations), or may be provided at one location in the vibrator electrode 31. It should be noted, however, that the opening area ratio (relative to the hole pattern 11a) and the arrangement conditions (inclusive of the number) of the hole portion or portions 31a are appropriately set so that an output in the frequency band desired can be obtained where the micromachine obtained according to the second embodiment is used as a high-frequency filter.

Next, as shown in FIG. 5B, a wiring 17 connected to the vibration electrode 31 is formed on the second insulation film 11. This step is carried out in the same manner as described above referring to FIG. 1G in the first embodiment.

Thereafter, in the same manner as in the first embodiment, the sacrificing layer 13 is etched away selectively in relation to the wiring 17, the vibrator electrode 31, the second insulation film 11 and the output electrode 7. In this case, wet etching by use of buffered hydrofluoric acid is conducted, whereby the etching solution is supplied through the hole portion 31a to the sacrificing layer 13, and the sacrificing layer 13 composed of silicon oxide on the lower side of the vibrator electrode 31 is securely removed.

As a result, as shown in FIG. 5C and FIG. 7, the sacrificing layer on the lower side of the vibrator electrode 31 is removed to form a space portion (gap) A, and the output electrode 7 in the bottom portion of the hole pattern 11a is exposed. Thus, there is obtained a micromachine 40 in which the belt-like vibrator electrode 31 which closes the hole pattern 11a as the space portion A and which is provided with the hole portion 31a communicated to the space portion A in the hole pattern 11a is provided on the second insulation film 11.

In the micromachine 40 configured as above, the hole pattern 11a is provided as the space portion A, the vibrator electrode 31 is so disposed as to close the upper side of the hole pattern 11a, and the vibrator electrode 31 is provided with the hole portion 31a communicated to the space portion A. Therefore, where the vibrator electrode 31 is vibrated by impressing a specified frequency voltage thereon, that portion of the vibrator electrode 31 which closes the hole pattern 11a is vibrated and, thus, the portion constitutes a beam (vibrating portion) 31b of the vibrator electrode 31. Therefore, the length (beam length L) of the beam (vibrating portion) 31b is set by the size of the hole pattern 11a. Accordingly, in the same manner as in the first embodiment, it is possible to set the length (beam length L) of the beam (vibrating portion) 31b by the size of the hole pattern 11a, independently of the line width of the output electrode 7. As a result, it is possible to achieve a higher frequency through miniaturization of the beam length L and to maintain the output.

Particularly, in the micromachine 40 according to the second embodiment, the hole pattern 11a is closed with the beam (vibrating portion) 31b, so that the beam (vibrating portion) 31b is supported by and fixed to the second insulation-film 11 over the entire perimeter thereof. Therefore, the vibration frequency of the vibrator electrode 31 can be made further higher, as compared to the case of the micromachine according to the first embodiment.

Furthermore, in the micromachine 40 configured according to the second embodiment, also, both end portions, i.e., the anchor portions for supporting the beam (vibrating portion) 31b, of the vibrator electrode 31 are fixed to the second insulation film 11 over the entire surfaces thereof. Therefore, in the same manner as in the micromachine according to the first embodiment, only the beam (vibrating portion) 31b relates to vibration, in generating vibration. Accordingly, it is possible to realize a high-frequency filter having a high Q value and a higher frequency band.

In the above-described second embodiment, also, as indicated by the two-dotted chain line in FIG. 6, the vibrator electrode 31c may have such a shape that larger-line-width portions are provided at both end portions thereof, whereby it is possible to securely support the beam (vibrating portion) 31b and to achieve a further enhancement of the natural vibration frequency.

In addition, even in the micromachine 40 according to the second embodiment, the vibrator electrode 31 per se functions also as the input electrode, and, therefore, the same effect as described above referring to FIG. 4 in the first embodiment can be obtained.

As has been described above, according to the micromachine and the method of manufacturing the same according to the present invention, with the configuration in which the inter-layer insulation film covering the output electrode is provided with the hole pattern and the vibrator electrode crossing the hole pattern is provided over the space portion constituted of the inside of the hole pattern, it is possible to set the length of the beam (vibrating portion) smaller than the width of the output electrode and to enlarge the capacitance between the output electrode and the vibrator electrode in relation to the length of the vibrating portion. Therefore, it becomes easy to achieve a higher frequency through miniaturization of the beam (vibrating portion) length and it becomes possible to realize a high-frequency filter having a high Q value and a higher frequency band.

What is claimed:

1. A micromachine comprising:
an output electrode provided on a substrate;
an inter-layer insulation film provided on said substrate in the state of covering said electrode provided on said substrate;
a hole pattern defined in said inter-layer insulation film reaching said electrode provided on said substrate, said hole pattern disposed on an upper surface of said electrode; and
a vibrator electrode provided on said inter-layer insulation film, said hole pattern defining one or more spaces between said output electrode and said vibrator electrode, said one or more spaces extending beyond one or more width sides of said vibrator electrode, a length of the vibrator electrode above the one or more spaces corresponds to a high frequency filter activated by applying a voltage to the vibrator electrode and the output electrode to generate a capacitance utilised by the high frequency filter.

2. A micromachine as set forth in claim 1, wherein the micromachine is a micro-vibrator operable to filter electronic signals for a desired frequency band.

3. A micromachine as set forth in claim 1, wherein the size of the one or more spaces corresponds to natural vibration frequencies associated with the length, the one or more spaces being associated with one or more output electrodes including the output electrode.

4. A micromachine as set forth in claim 1, wherein a specified frequency voltage is applied to the vibrator electrode, wherein the length of a vibrating portion of the vibrator electrode is defined by a size of the one or more spaces, wherein the micromachine is a micro-vibrator operable to filter radio communications at a high frequency utilizing a Q value corresponding to the vibrating portion of the vibrator electrode.

5. A micromachine as set forth in claim 1, wherein the one or more spaces extend beyond the output electrode on both of the one or more width sides, wherein the output electrode is a silicon layer formed of phosphorus containing polysilicon, wherein the one or more insulation layers include a first insulation layer, and a second insulation layer, the first insulation layer is buffed to expose the output electrode before the second insulation layer is disposed above the output electrode and the first insulation layer, wherein the first insulation layer is silicon oxide, wherein the second insulation layer is silicon nitride, wherein the space is formed utilizing a resist pattern as a mask and etching of the second insulation layer.

6. The micromachine of claim 1, wherein each of the one or more spaces corresponds to one of a plurality of output electrodes including the output electrode.

7. A micromachine comprising:
an output electrode formed on a substrate;
one or more insulation layers formed above the output electrode; and
a vibrator electrode disposed on the one or more insulation layers in a belt pattern, the one or more insulation layers defining a space between the output electrode and the vibrator electrode, the belt pattern defines one or a pair of holes through the vibrator electrode aligned with the space, the one or a pair of holes extending beyond one or more width sides of the vibrator electrode, a length of the vibrator electrode above the one or a pair of holes corresponds to a high frequency filter activated by applying a voltage to the vibrator electrode and the output electrode to generate a capacitance utilized by a high frequency filter.

8. The micromachine of claim 7, wherein a capacitor is formed between the output electrode and the vibrator electrode, wherein the size and the location of the one or more holes correspond to high frequency filter having a high Q value and a desired frequency band generated by the vibrator electrode.

9. The micromachine of claim 7, wherein the output electrode is a silicon layer formed of phosphorus containing polysilicon.

10. The micromachine of claim 7, wherein the one or more insulation layers include a first insulation layer, and a second insulation layer, the first insulation layer is buffed to expose the output electrode before the second insulation layer is disposed above the output electrode and the first insulation layer.

11. The micromachine of claim 10, wherein the first insulation layer is silicon oxide, wherein the second insulation layer is silicon nitride.

12. The micromachine of claim 10, wherein the one or a pair of holes is disposed through the vibrator electrode without extending beyond a periphery of a perimeter of the output electrode.

13. The micromachine of claim 12, wherein the one or a pair of holes of the belt pattern is formed utilizing a resist pattern as a mask and etching of the second insulation layer.

14. The micromachine of claim 7, wherein a specified frequency voltage is applied to the vibrator electrode, and wherein electronic filtering performed by the micromachine is performed in response to a length of a vibrating portion of the vibrator electrode as defined by a size of the one or a pair of holes.

15. The micromachine of claim 14, wherein the micromachine is a micro-vibrator operable to filter radio communications at a high frequency utilizing a Q value corresponding to the vibrating portion of the vibrator electrode.

16. The micromachine of claim 7, wherein a plating layer is grown on the vibrator electrode to form wiring, wherein the specified frequency voltage is applied through the wiring.

17. The micromachine of claim 14, wherein the vibrator electrode is wider at end portions to support the vibrating portion.

18. A micromachine comprising:
an output electrode disposed on a substrate;
one or more insulation layers formed above the output electrode; and a vibrator electrode disposed on the one or more insulation layers in a belt pattern, the one or more insulation layers defining a space between the output electrode and the vibrator electrode along a length of the vibrator electrode, the belt pattern defines one or more holes through the vibrator electrode, the one or a more holes aligned with the space, a size of a length of the vibrator electrode above the space corresponds to a high frequency filter applying a desired frequency band utilized by applying a voltage to the vibrator electrode and the output electrode.

19. The micromachine of claim 18, wherein the vibrator electrode is wider at end portions to support the vibrating portion.

20. The micromachine of claim 18, wherein the micromachine is a micro-vibrator operable to filter radio communications at a high frequency utilizing a Q value corresponding to the vibrating portion of the vibrator electrode, the Q value corresponding to capacitance between the vibrator electrode and the output electrode within the space.

* * * * *